(12) United States Patent
Shin et al.

(10) Patent No.: US 9,230,898 B2
(45) Date of Patent: Jan. 5, 2016

(54) INTEGRATED CIRCUIT PACKAGING SYSTEM WITH PACKAGE-ON-PACKAGE AND METHOD OF MANUFACTURE THEREOF

(75) Inventors: HanGil Shin, Seongnam-si (KR); DeokKyung Yang, Hanam-si (KR); Jong-Woo Ha, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 970 days.

(21) Appl. No.: 12/542,097

(22) Filed: Aug. 17, 2009

(65) Prior Publication Data

US 2011/0037157 A1 Feb. 17, 2011

(51) Int. Cl.
| | |
|---|---|
| *H01L 23/48* | (2006.01) |
| *H01L 23/52* | (2006.01) |
| *H01L 29/40* | (2006.01) |
| *H01L 23/498* | (2006.01) |
| *H01L 25/10* | (2006.01) |
| *H01L 25/00* | (2006.01) |
| *H01L 23/31* | (2006.01) |
| *H01L 25/065* | (2006.01) |
| *H01L 23/00* | (2006.01) |

(52) U.S. Cl.
CPC .... *H01L 23/49827* (2013.01); *H01L 23/49833* (2013.01); *H01L 25/105* (2013.01); *H01L 25/50* (2013.01); *H01L 23/3128* (2013.01); *H01L 24/48* (2013.01); *H01L 25/0655* (2013.01); *H01L 2224/16145* (2013.01); *H01L 2224/16225* (2013.01); *H01L 2224/32145* (2013.01); *H01L 2224/32225* (2013.01); *H01L 2224/48225* (2013.01); *H01L 2224/48227* (2013.01); *H01L 2224/73207* (2013.01); *H01L 2224/73265* (2013.01); *H01L 2225/06568* (2013.01); *H01L 2225/1023* (2013.01); *H01L 2225/1058* (2013.01); *H01L 2225/1088* (2013.01); *H01L 2924/10253* (2013.01); *H01L 2924/15311* (2013.01); *H01L 2924/1815* (2013.01); *H01L 2924/18161* (2013.01); *H01L 2924/30107* (2013.01); *H01L 2924/3511* (2013.01)

(58) Field of Classification Search
USPC .......... 257/686, 698, 777, E23.011, E23.142, 257/E21.142; 438/107, 124
See application file for complete search history.

(56) References Cited

U.S. PATENT DOCUMENTS

| | | | |
|---|---|---|---|
| 5,258,648 A * | 11/1993 | Lin ................................ | 257/778 |
| 5,598,033 A | 1/1997 | Behlen et al. | |
| 7,061,087 B2 | 6/2006 | Kim | |
| 7,198,980 B2 * | 4/2007 | Jiang et al. .................... | 438/107 |
| 7,545,047 B2 * | 6/2009 | Bauer et al. ................... | 257/774 |
| 7,550,836 B2 * | 6/2009 | Chou et al. .................... | 257/686 |
| 7,553,752 B2 | 6/2009 | Kuan et al. | |
| 7,675,181 B2 * | 3/2010 | Lee ................................ | 257/777 |
| 7,977,802 B2 * | 7/2011 | Pagaila et al. ................. | 257/778 |
| 8,193,644 B2 * | 6/2012 | Takahashi ..................... | 257/774 |
| 2007/0126122 A1 * | 6/2007 | Bauer et al. ................... | 257/774 |
| 2007/0190690 A1 | 8/2007 | Chow et al. | |
| 2009/0081867 A1 * | 3/2009 | Taguchi et al. ............... | 438/675 |
| 2010/0065948 A1 | 3/2010 | Bae et al. | |
| 2010/0123233 A1 | 5/2010 | Yoon et al. | |

* cited by examiner

*Primary Examiner* — Sonya D McCall Shepard
(74) *Attorney, Agent, or Firm* — Ishimaru & Associates LLP

(57) ABSTRACT

A method of manufacture of an integrated circuit packaging system includes: providing a substrate; mounting a component over a side of the substrate; forming an interface module having a module via in any location for connectivity to the substrate; and mounting the entirety of the interface module over a portion of the side of the substrate next to the component.

18 Claims, 4 Drawing Sheets

INTEGRATED CIRCUIT PACKAGING SYSTEM WITH PACKAGE-ON-PACKAGE AND METHOD OF MANUFACTURE THEREOF

TECHNICAL FIELD

The present invention relates generally to an integrated circuit packaging system, and more particularly to a system for an integrated circuit packaging system with package-on-package.

BACKGROUND ART

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration, performance, and cost reduction.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Thus, a need still remains for an integrated circuit packaging system providing space savings and low cost manufacturing. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; mounting a component over a side of the substrate; forming an interface module having a module via in any location for connectivity to the substrate; and mounting the entirety of the interface module over a portion of the side of the substrate next to the component.

The present invention provides an integrated circuit packaging system, including: a substrate; a component over a side of the substrate; and an interface module having a module via in any location for connectivity to the substrate, the entirety of the interface module over a portion of the side of the substrate next to the component.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
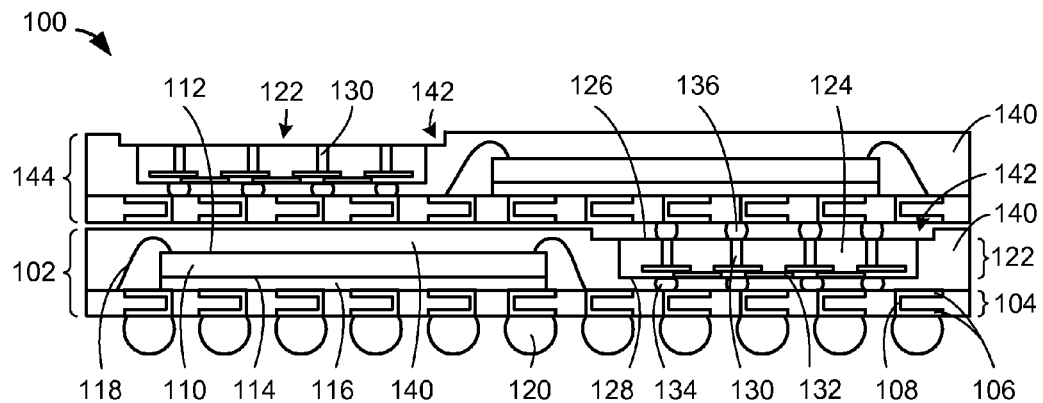
FIG. 1 is a cross-sectional view of an integrated circuit packaging system along a section line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 2:
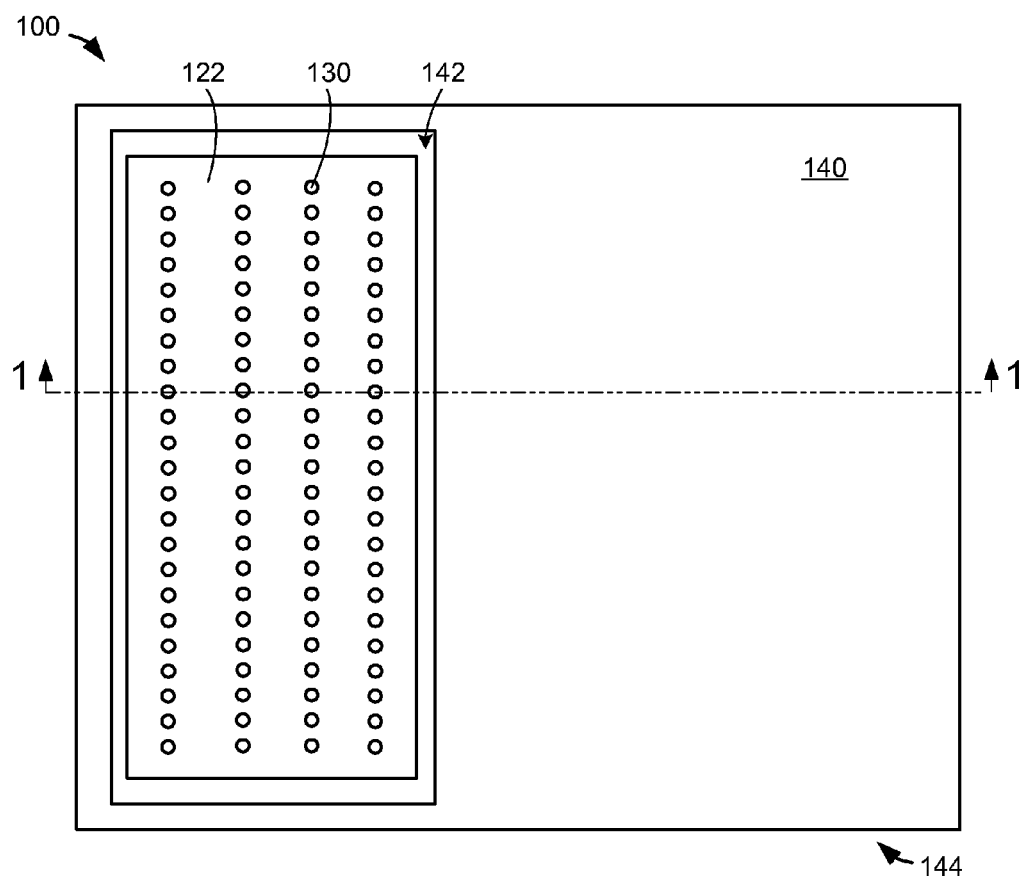
FIG. 2 is a top view of the integrated circuit packaging system.

Referring now to FIG. 1, therein is shown a cross-sectional view of an integrated circuit packaging system 100 along a section line 1-1 of FIG. 2 in a first embodiment of the present invention. The integrated circuit packaging system 100 can include a base integrated circuit package 102.

The base integrated circuit package 102 can include a substrate 104, such as a printed circuit board (PCB), a laminated plastic substrate, a laminated ceramic substrate, or a carrier. The substrate 104 can include a substrate pad 106, such as a contact pad, a bond pad, or a bump pad, and a substrate via 108, such as a hole filled with a conductive material. The substrate pad 106 and the substrate via 108 can be connected for providing an electrical interconnection between a top surface and a bottom surface of the substrate 104.

The base integrated circuit package 102 can include a component 110, such as an integrated circuit, a die, a flip chip, or a chip having a redistribution layer (RDL). The component 110 can include an active side 112 and an inactive side 114 at an opposing side of the active side 112. The active side 112 can include active circuitry (not shown) fabricated thereon. The inactive side 114 can be a backside of the component 110.

The component 110 can be mounted over a side of the substrate 104 with the inactive side 114 facing the substrate 104. The component 110 can be attached to the substrate 104 with an attach layer 116, such as a die attach or an adhesive. The component 110 can be connected to the substrate pad 106 with an electrical interconnect 118, such as a bond wire, a ribbon bond wire, or a conductive wire.

The integrated circuit packaging system 100 can include an external interconnect 120, such as a solder ball, a solder bump, or a conductive material. The external interconnect 120 can be attached to the substrate 104. The external interconnect 120 can be under the substrate 104.

The base integrated circuit package 102 can include an interface module 122, such as a through-silicon via (TSV) interposer, an interposed substrate, a PCB interposer, a TSV die, a silicon interposer, or a three-dimensional (3D) interconnect. The interface module 122 can include a silicon wafer, a substrate, a conductor, a through-silicon via (TSV), a trace, a multi-layer wire, a contact, a pad, or any combination thereof. The interface module 122 can include functions for stacking, interposing, interfacing, or interconnecting multiple integrated circuit packaging systems or 3D integrated circuit packaging systems.

The interface module 122 can include a module body 124 having an outer side 126 and an inner side 128 at an opposing side of the outer side 126. The module body 124 can include a wafer, a substrate, or a component formed with silicon, dielectric, or nonconductive material.

The interface module 122 can provide an electrical connection between the outer side 126 and the inner side 128. The electrical connection can be provided with a module via 130, such as a through-silicon via (TSV), a through-substrate via (TSV), or a hole filled with a conductive material. The module via 130 can optionally be formed through the module body 124, extending from the outer side 126 to the inner side 128. The electrical connection can also be provided with a module interconnect 132, such as a trace, a multilayer wire, a routing via, a conductor, or a combination thereof. The module via 130 can be formed across the interface module 122 in an area array, perimeter array, or any location for providing connectivity to the substrate 104.

The interface module 122 can be adjacent the component 110, the entirety of the interface module 122 over a portion of the side of the substrate 104 next to the component 110. The base integrated circuit package 102 can include any number of the interface module 122. The interface module 122 can have any shape or size. The interface module 122 can include a height similar to a height of the component 110 for supporting or stacking components or integrated circuit packaging systems and providing a uniform thickness of the base integrated circuit package 102. The height of the interface module 122 can include spacing for the module via 130 and the module interconnect 132.

The interface module 122 can be mounted over the substrate 104 with the inner side 128 facing the substrate 104. The interface module 122 can be connected or attached to the substrate 104 with a module-to-substrate interconnect 134, such as a solder ball, a conductive ball, or a solder bump. The module-to-substrate interconnect 134 can directly attach or connect the inner side 128 of the interface module 122 and the substrate pad 106 of the substrate 104.

The module-to-substrate interconnect 134 can have any shape or size. For example, the module-to-substrate interconnect 134 has a height that is smaller than that of the external interconnect 120.

The integrated circuit packaging system 100 can include a module-to-package interconnect 136, such as a solder ball, a conductive ball, or a solder bump, attached to or on the interface module 122. The module-to-package interconnect 136 can be directly attached to or on the outer side 126.

The module-to-package interconnect 136 can have any shape or size. For example, the module-to-package interconnect 136 has a height that is smaller than that of the external interconnect 120 or larger than that of the module-to-substrate interconnect 134.

The base integrated circuit package 102 can include an encapsulation 140, such as a cover including an epoxy molding compound (EMC). The encapsulation 140 can be molded over the substrate 104, the component 110, the attach layer 116, the electrical interconnect 118, the interface module 122, and the module-to-substrate interconnect 134. A top of the encapsulation 140 can be over or above the outer side 126.

The encapsulation 140 can be molded with a film assisted mold (FAM) or a step mold chase. The encapsulation 140 can include a recess 142 exposing a portion of the outer side 126 of the interface module 122. The encapsulation 140 can be coplanar with the outer side 126 in the recess 142.

The integrated circuit packaging system 100 can include a stack component 144, such as a package, a system-in-a-package (SiP), a passive device, an active device, a chip, an integrated circuit, a package, a PCB interposer, or any integrated circuit package in other embodiments. For example, the stack component 144 can be identical to the base integrated circuit package 102.

The stack component 144 can have an orientation opposite to an orientation of the base integrated circuit package 102. For example, the stack component 144 can be horizontally flipped.

The stack component 144 can be mounted over the interface module 122 of the base integrated circuit package 102. The stack component 144 can be connected or directly attached to the base integrated circuit package 102 with the module-to-package interconnect 136. The stack component 144 can be connected to the substrate 104 by the interface module 122.

For purposes of illustration, the integrated circuit packaging system 100 is shown with the base integrated circuit package 102 and the stack component 144. The integrated circuit packaging system 100 can include any number of the stack component 144.

It has been discovered that the present invention can provide an improvement in integration. The present invention can allow additional functional devices mounted over the interface module 122, particularly with a limited area of the base integrated circuit package 102.

It has also been discovered that the present invention can reduce a total package profile without reducing a total input/output (I/O) count. The module-to-package interconnect 136 can include a small size. The base integrated circuit package 102 can include a predetermined ball pitch smaller than a ball pitch of solder balls in the conventional package-on-package (PoP) packaging systems for interconnecting the base integrated circuit package 102 and the stack component 144. The interface module 122 can be adjacent the component 110, thereby reducing a height of the base integrated circuit package 102.

Referring now to FIG. 2, therein is shown a top view of the integrated circuit packaging system 100. The integrated circuit packaging system 100 can include the stack component 144. The stack component 144 can include the interface module 122 mounted next to or at a side of the stack component 144.

The interface module 122 can include functions for stacking, interposing, interfacing, or interconnecting multiple integrated circuit packaging systems or 3D integrated circuit packaging systems. The interface module 122 can include the module via 130 for interconnecting multiple stacked integrated circuit packaging systems.

The stack component 144 can include the encapsulation 140. The encapsulation 140 can include the recess 142 exposing a portion of the interface module 122. The encapsulation 140 can be coplanar with the recess 142.

Figure 3:
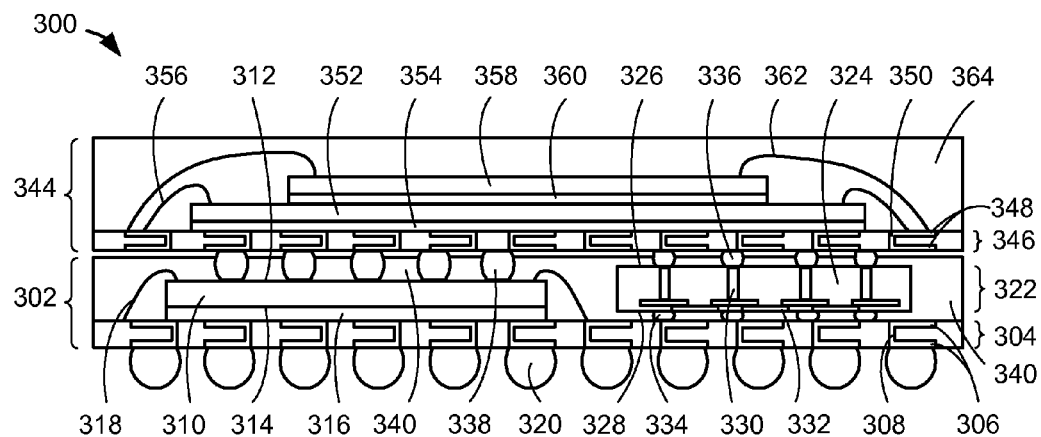
FIG. 3 is a cross-sectional view of an integrated circuit packaging system along a section line 3-3 of FIG. 4 in a second embodiment of the present invention.
Figure 4:
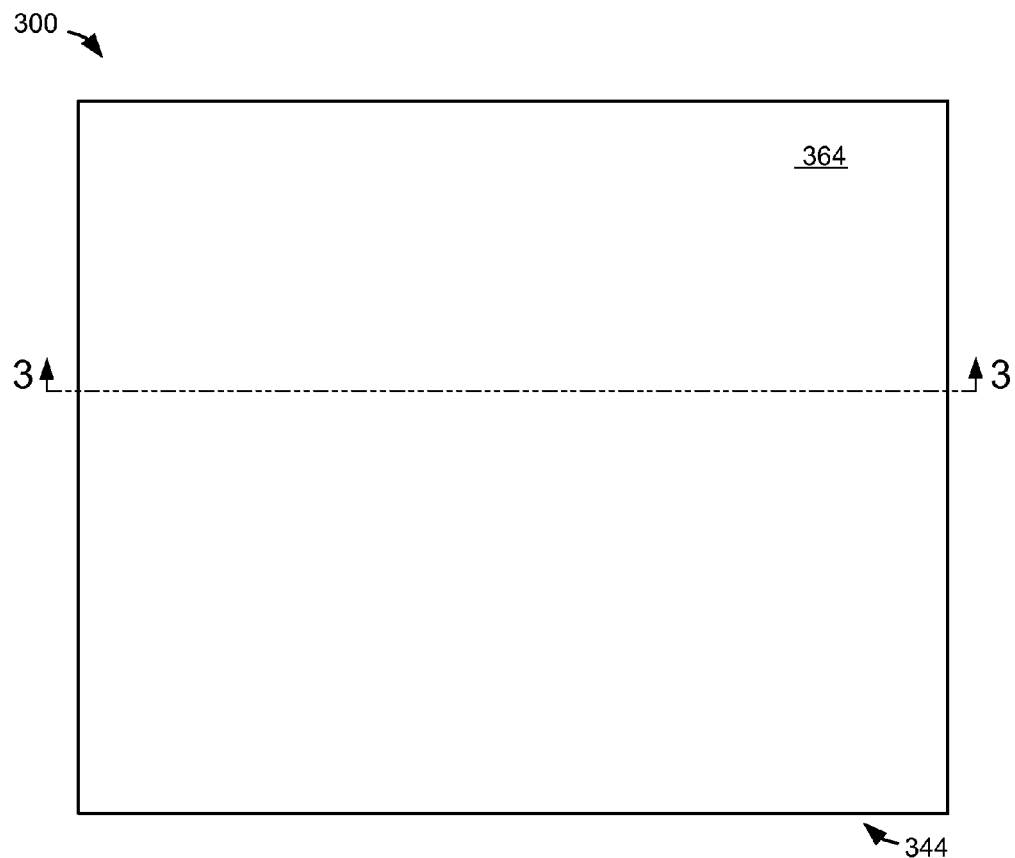
FIG. 4 is a top view of the integrated circuit packaging system.

Referring now to FIG. 3, therein is shown a cross-sectional view of an integrated circuit packaging system 300 along a section line 3-3 of FIG. 4 in a second embodiment of the present invention. The integrated circuit packaging system 300 can include a base integrated circuit package 302.

The base integrated circuit package 302 can include a substrate 304, such as a printed circuit board (PCB), a laminated plastic substrate, a laminated ceramic substrate, or a carrier. The substrate 304 can include a substrate pad 306, such as a contact pad, a bond pad, or a bump pad, and a substrate via 308, such as a hole filled with a conductive material. The substrate pad 306 and the substrate via 308 can be connected for providing an electrical interconnection between a top surface and a bottom surface of the substrate 304.

The base integrated circuit package 302 can include a component 310, such as an integrated circuit, a die, a flip chip, or a chip having a redistribution layer (RDL). The component 310 can include an active side 312 and an inactive side 314 at an opposing side of the active side 312. The active side 312 can include active circuitry (not shown) fabricated thereon. The inactive side 314 can be a backside of the component 310.

The component 310 can be mounted over a side of the substrate 304 with the inactive side 314 facing the substrate 304. The component 310 can be attached to the substrate 304 with an attach layer 316, such as a die attach or an adhesive. The component 310 can be connected to the substrate pad 306 with an electrical interconnect 318, such as a bond wire, a ribbon bond wire, or a conductive wire.

The integrated circuit packaging system 300 can include an external interconnect 320, such as a solder ball, a solder bump, or a conductive material. The external interconnect 320 can be attached to the substrate 304. The external interconnect 320 can be under the substrate 304.

The base integrated circuit package 302 can include an interface module 322, such as a through-silicon via (TSV) interposer, an interposed substrate, a PCB interposer, a TSV die, a silicon interposer, or a three-dimensional (3D) interconnect. The interface module 322 can include a silicon wafer, a substrate, a conductor, a through-silicon via (TSV), a trace, a multi-layer wire, a contact, a pad, or any combination thereof. The interface module 322 can include functions for stacking, interposing, interfacing, or interconnecting multiple integrated circuit packaging systems or 3D integrated circuit packaging systems.

The interface module 322 can include a module body 324 having an outer side 326 and an inner side 328 at an opposing side of the outer side 326. The module body 324 can include a wafer, a substrate, or a component formed with silicon, dielectric, or nonconductive material.

The interface module 322 can provide an electrical connection between the outer side 326 and the inner side 328. The electrical connection can be provided with a module via 330, such as a through-silicon via (TSV), a through-substrate via (TSV), or a hole filled with a conductive material. The module via 330 can optionally be formed through the module body 324, extending from the outer side 326 to the inner side 328. The electrical connection can also be provided with a module interconnect 332, such as a trace, a multilayer wire, a routing via, a conductor, or a combination thereof. The module via 330 can be formed across the interface module 322 in an area array, perimeter array, or any location.

The interface module 322 can be adjacent the component 310, the entirety of the interface module 322 over a portion of the side of the substrate 304 next to the component 310. The base integrated circuit package 302 can include any number of the interface module 322. The interface module 322 can have any shape or size. The interface module 322 can include a height similar to a height of the component 310 for supporting or stacking components or integrated circuit packaging systems and providing a uniform thickness of the base integrated circuit package 302. The height of the interface module 322 can include spacing for the module via 330 and the module interconnect 332.

The interface module 322 can be mounted over the substrate 304 with the inner side 328 facing the substrate 304. The interface module 322 can be connected or attached to the substrate 304 with a module-to-substrate interconnect 334, such as a solder ball, a conductive ball, or a solder bump. The module-to-substrate interconnect 334 can directly attach or connect the inner side 328 of the interface module 322 and the substrate pad 306 of the substrate 304.

The module-to-substrate interconnect 334 can have any shape or size. For example, the module-to-substrate interconnect 334 has a height that is smaller than that of the external interconnect 320.

The base integrated circuit package 302 can include a module-to-package interconnect 336, such as a solder ball, a conductive ball, or a solder bump, attached to or on the interface module 322. The module-to-package interconnect 336 can be directly attached to or on the outer side 326.

The module-to-package interconnect 336 can have any shape or size. For example, the module-to-package interconnect 336 has a height that is smaller than that of the external interconnect 320 or larger than that of the module-to-substrate interconnect 334.

The base integrated circuit package 302 can include a component-to-package interconnect 338, such as a solder ball, a conductive ball, or a solder bump, attached to or on the component 310. The component-to-package interconnect 338 can be connected to the active side 312. The component-to-package interconnect 338 can be connected to the RDL (not shown) on the active side 312. A sum of a height of the module-to-substrate interconnect 334 and a height of the module-to-package interconnect 336 can be similar to a height of the component-to-package interconnect 338 for providing a uniform thickness of the base integrated circuit package 302.

The base integrated circuit package 302 can include an encapsulation 340, such as a cover including an epoxy molding compound (EMC). The encapsulation 340 can be molded over the substrate 304, the component 310, the attach layer 316, the electrical interconnect 318, the interface module 322, the module-to-substrate interconnect 334, the module-to-package interconnect 336, and the component-to-package interconnect 338.

A top of the encapsulation 340 can be over or above the outer side 326. The module-to-substrate interconnect 334 and the component-to-package interconnect 338 can be partially exposed from the encapsulation 340.

The integrated circuit packaging system 300 can include a stack component 344, such as a package, a system-in-a-package (SiP), a passive device, an active device, a chip, an integrated circuit, a package, a PCB interposer, or any integrated circuit package in other embodiments. The stack component 344 can be mounted over the interface module 322 of the base integrated circuit package 302. The stack component 344 can be connected or directly attached to the interface module 322 or the component 310 with the module-to-package interconnect 336 or the component-to-package interconnect 338, respectively. The stack component 344 can be connected to the substrate 304 by the interface module 322.

The stack component 344 can include a stack substrate 346, such as a printed circuit board (PCB), a laminated plastic substrate, a laminated ceramic substrate, or a carrier. The stack substrate 346 can include a stack substrate pad 348, such as a contact pad, a bond pad, or a bump pad, and a stack substrate via 350, such as a hole filled with a conductive material. The stack substrate pad 348 and the stack substrate via 350 can be connected for providing an electrical interconnection between a top surface and a bottom surface of the stack substrate 346.

The module-to-package interconnect 336 can connect the interface module 322 and the stack substrate 346. The component-to-package interconnect 338 can connect the component 310 and the stack substrate 346.

The stack component 344 can include a first stack component 352, such as a chip, an integrated circuit, a die, or a flip chip. The first stack component 352 can be mounted over the stack substrate 346. The first stack component 352 can be attached to the stack substrate 346 with a first stack attach layer 354, such as a die attach or an adhesive. The first stack component 352 can be connected to the stack substrate 346 with a first stack interconnect 356, such as a bond wire, a ribbon bond wire, or a conductive wire.

The stack component 344 can include a second stack component 358, such as a chip, an integrated circuit, a die, or a flip chip. The second stack component 358 can be mounted over the first stack component 352. The second stack component 358 can be attached to the first stack component 352 with a second stack attach layer 360, such as a die attach or an adhesive. The second stack component 358 can be connected to the stack substrate 346 with a second stack interconnect 362, such as a bond wire, a ribbon bond wire, or a conductive wire.

The stack component 344 can include a stack encapsulation 364, such as a cover including an epoxy molding compound (EMC). The stack encapsulation 364 can be molded over the stack substrate 346, the first stack component 352, the first stack attach layer 354, the first stack interconnect 356, the second stack component 358, the second stack attach layer 360, and the second stack interconnect 362.

It has been discovered that the present invention can improve package warpage compared to conventional package-on-package (PoP) packaging systems. The encapsulation 340 can be molded to fill or cover the whole area of the base integrated circuit package 302. The module-to-package interconnect 336 and the component-to-package interconnect 338 can be partially exposed from the encapsulation 340. Thus, the present invention can improve solder interconnection quality, similar to integrated circuit packaging systems with an exposed solder-on-pad (eSOP).

It has also been discovered that the present invention can provide flexibility. The module-to-package interconnect 336 or the component-to-package interconnect 338 can be flexibly arranged based on configurations of the stack component 344. The interface module 322 can allow the stack component 344 to have more flexibility in structure configuration.

It has further been discovered that the present invention can provide reliability. The present invention can provide the interface module 322 embedded in the encapsulation 340, thereby preventing a top surface of the module-to-package interconnect 336 or a top surface of the component-to-package interconnect 338 from being damaged during package assembly process.

Referring now to FIG. 4, therein is shown a top view of the integrated circuit packaging system 300. The integrated circuit packaging system 300 can include the stack component 344. The stack component 344 can include the stack encapsulation 364. The stack component 344 can be mounted over the base integrated circuit package 302 of FIG. 3.

Figure 5:
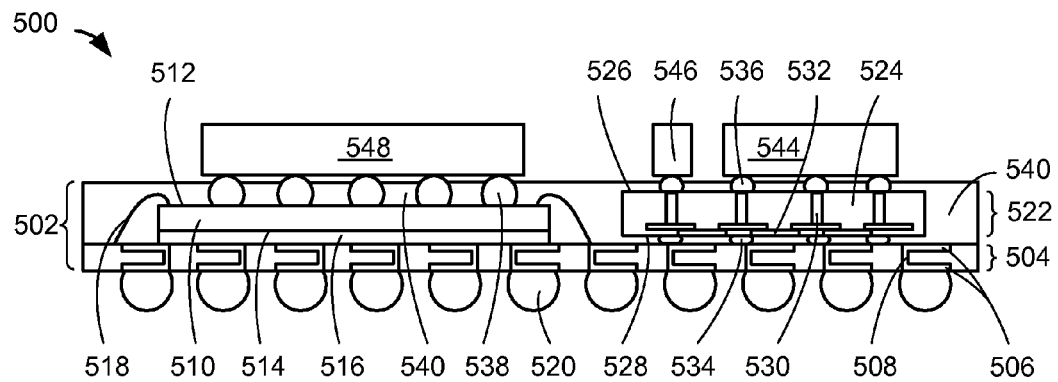
FIG. 5 is a cross-sectional view of an integrated circuit packaging system along a section line 5-5 of FIG. 6 in a third embodiment of the present invention.
Figure 6:
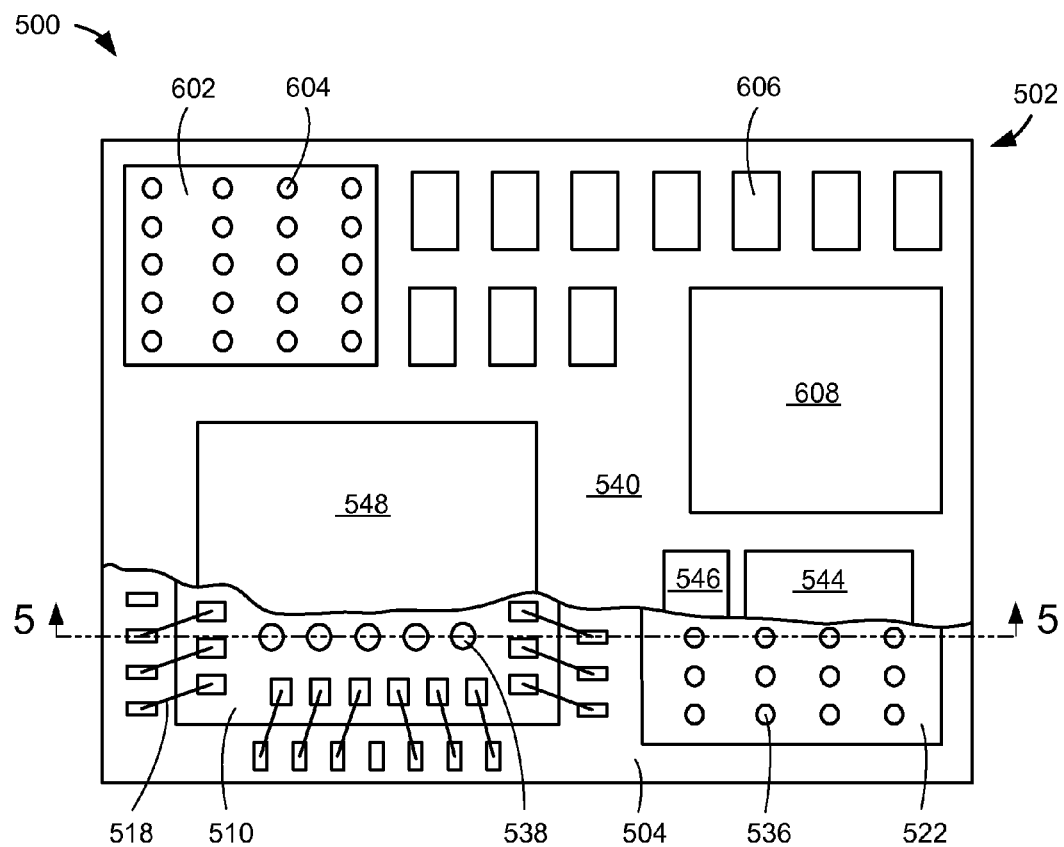
FIG. 6 is a top view of the integrated circuit packaging system with part of the top removed.

Referring now to FIG. 5, therein is shown a cross-sectional view of an integrated circuit packaging system 500 along a section line 5-5 of FIG. 6 in a third embodiment of the present invention. The integrated circuit packaging system 500 can include a base integrated circuit package 502.

The base integrated circuit package 502 can include a substrate 504, such as a printed circuit board (PCB), a laminated plastic substrate, a laminated ceramic substrate, or a carrier. The substrate 504 can include a substrate pad 506, such as a contact pad, a bond pad, or a bump pad, and a substrate via 508, such as a hole filled with a conductive material. The substrate pad 506 and the substrate via 508 can be connected for providing an electrical interconnection between a top surface and a bottom surface of the substrate 504.

The base integrated circuit package 502 can include a component 510, such as an integrated circuit, a die, a flip chip, or a chip having a redistribution layer (RDL). The component 510 can include an active side 512 and an inactive side 514 at an opposing side of the active side 512. The active side 512 can include active circuitry (not shown) fabricated thereon. The inactive side 514 can be a backside of the component 510.

The component 510 can be mounted over a side of the substrate 504 with the inactive side 514 facing the substrate 504. The component 510 can be attached to the substrate 504 with an attach layer 516, such as a die attach or an adhesive.

The component 510 can be connected to the substrate pad 506 with an electrical interconnect 518, such as a bond wire, a ribbon bond wire, or a conductive wire.

The integrated circuit packaging system 500 can include an external interconnect 520, such as a solder ball, a solder bump, or a conductive material. The external interconnect 520 can be attached to the substrate 504. The external interconnect 520 can be under the substrate 504.

The base integrated circuit package 502 can include an interface module 522, such as a through-silicon via (TSV) interposer, an interposed substrate, a PCB interposer, a TSV die, a silicon interposer, or a three-dimensional (3D) interconnect. The interface module 522 can include a silicon wafer, a substrate, a conductor, a through-silicon via (TSV), a trace, a multi-layer wire, a contact, a pad, or any combination thereof. The interface module 522 can include functions for stacking, interposing, interfacing, or interconnecting multiple integrated circuit packaging systems or 3D integrated circuit packaging systems.

The interface module 522 can include a module body 524 having an outer side 526 and an inner side 528 at an opposing side of the outer side 526. The module body 524 can include a wafer, a substrate, or a component formed with silicon, dielectric, or nonconductive material.

The interface module 522 can provide an electrical connection between the outer side 526 and the inner side 528. The electrical connection can be provided with a module via 530, such as a through-silicon via (TSV), a through-substrate via (TSV), or a hole filled with a conductive material. The module via 530 can optionally be formed through the module body 524, extending from the outer side 526 to the inner side 528. The electrical connection can also be provided with a module interconnect 532, such as a trace, a multilayer wire, a routing via, a conductor, or a combination thereof. The module via 530 can be formed across the interface module 522 in an area array, perimeter array, or any location.

The interface module 522 can be adjacent the component 510, the entirety of the interface module 522 over a portion of the side of the substrate 504 next to the component 510. The base integrated circuit package 502 can include any number of the interface module 522. The interface module 522 can have any shape or size. The interface module 522 can include a height similar to a height of the component 510 for supporting or stacking components or integrated circuit packaging systems and providing a uniform thickness of the base integrated circuit package 502. The height of the interface module 522 can include spacing for the module via 530 and the module interconnect 532.

The interface module 522 can be mounted over the substrate 504 with the inner side 528 facing the substrate 504. The interface module 522 can be connected or attached to the substrate 504 with a module-to-substrate interconnect 534, such as a solder ball, a conductive ball, or a solder bump. The module-to-substrate interconnect 534 can directly attach or connect the inner side 528 of the interface module 522 and the substrate pad 506 of the substrate 504.

The module-to-substrate interconnect 534 can have any shape or size. For example, the module-to-substrate interconnect 534 has a height that is smaller than that of the external interconnect 520.

The base integrated circuit package 502 can include a module-to-package interconnect 536, such as a solder ball, a conductive ball, or a solder bump, attached to or on the interface module 522. The module-to-package interconnect 536 can be directly attached to or on the outer side 526.

The module-to-package interconnect 536 can have any shape or size. For example, the module-to-package interconnect 536 has a height that is smaller than that of the external interconnect 520 or larger than that of the module-to-substrate interconnect 534.

The base integrated circuit package 502 can include a component-to-package interconnect 538, such as a solder ball, a conductive ball, or a solder bump, attached to or on the component 510. The component-to-package interconnect 538 can be connected to the active side 512. The component-to-package interconnect 538 can be connected to the RDL (not shown) on the active side 512. A sum of a height of the module-to-substrate interconnect 534 and a height of the module-to-package interconnect 536 can be similar to a height of the component-to-package interconnect 538 for providing a uniform thickness of the base integrated circuit package 502.

The base integrated circuit package 502 can include an encapsulation 540, such as a cover including an epoxy molding compound (EMC). The encapsulation 540 can be molded over the substrate 504, the component 510, the attach layer 516, the electrical interconnect 518, the interface module 522, the module-to-substrate interconnect 534, the module-to-package interconnect 536, and the component-to-package interconnect 538.

A top of the encapsulation 540 can be over or above the outer side 526. The module-to-substrate interconnect 534 and the component-to-package interconnect 538 can be partially exposed from the encapsulation 540.

The integrated circuit packaging system 500 can include a first stack component 544, such as an electrical component, a system-in-a-package (SiP), a passive device, an active device, a chip, an integrated circuit, a package, a PCB interposer, or any integrated circuit package in other embodiments. The first stack component 544 can be mounted over or on the interface module 522.

The first stack component 544 can be connected or directly attached to the interface module 522 with the module-to-package interconnect 536. The first stack component 544 can be connected to the substrate 504 by the interface module 522.

The integrated circuit packaging system 500 can include a second stack component 546, such as an electrical component, a system-in-a-package (SiP), a passive device, an active device, a chip, an integrated circuit, a package, a PCB interposer, or any integrated circuit package in other embodiments. The second stack component 546 can be mounted over or on the interface module 522.

The second stack component 546 can be connected or directly attached to the interface module 522 with the module-to-package interconnect 536. The second stack component 546 can be connected to the substrate 504 by the interface module 522.

The integrated circuit packaging system 500 can include a third stack component 548, such as an electrical component, a system-in-a-package (SiP), a passive device, an active device, a chip, an integrated circuit, a package, a PCB interposer, or any integrated circuit package in other embodiments. The third stack component 548 can be mounted over or on the component 510. The third stack component 548 can be connected or directly attached to the component 510 with the component-to-package interconnect 538.

Referring now to FIG. 6, therein is shown a top view of the integrated circuit packaging system 500 with part of the top removed. The integrated circuit packaging system 500 can include the base integrated circuit package 502. A portion of the encapsulation 540 is removed for clarity.

The base integrated circuit package 502 can include the substrate 504. The component 510 can be mounted over the substrate 504. The component 510 can be connected to the substrate 504 with the electrical interconnect 518.

The base integrated circuit package 502 can include the interface module 522 adjacent the component 510. The interface module 522 can be mounted over the substrate 504. The integrated circuit packaging system 500 can include the module-to-package interconnect 536 directly attached to or on the interface module 522.

The base integrated circuit package 502 can include the component-to-package interconnect 538 attached to or on the component 510. The component-to-package interconnect 538 can be connected to the active side 512 of FIG. 5. The component-to-package interconnect 538 can be connected to the RDL (not shown) on the active side 512.

The integrated circuit packaging system 500 can include the first stack component 544 or the second stack component 546 mounted over or on the interface module 522. The first stack component 544 or the second stack component 546 can be connected or directly attached to the interface module 522 with the module-to-package interconnect 536. The integrated circuit packaging system 500 can include the third stack component 548 mounted over or on the component 510. The third stack component 548 can be connected or directly attached to the component 510 with the component-to-package interconnect 538.

The base integrated circuit package 502 can include an additional interface module 602, such as a through-silicon via (TSV) interposer, a TSV die, a silicon interposer, or a three-dimensional (3D) interconnect. The additional interface module 602 can include a silicon wafer, a substrate, a conductor, a through-silicon via (TSV), a trace, a multi-layer wire, a contact, a pad, or any combination thereof.

The additional interface module 602 can include functions for stacking, interposing, interfacing, or interconnecting multiple integrated circuit packaging systems or 3D integrated circuit packaging systems. The additional interface module 602 can be mounted adjacent the component 510 at a quadrant opposing the interface module 522. The additional interface module 602 can be mounted anywhere over the substrate 504. The additional interface module 602 can be connected or attached to the substrate 504 with a conductive interconnect, such as a solder ball, a conductive ball, or a solder bump.

The additional interface module 602 can be identical to or different from the interface module 522. For example, the additional interface module 602 can have a surface dimension that is different from a surface dimension of the interface module 522. The base integrated circuit package 502 can include an additional module-to-package interconnect 604, such as a solder ball, a conductive ball, or a solder bump, attached to or on the additional interface module 602.

The integrated circuit packaging system 500 can include a passive component 606, such as a resistor, a capacitor, or an inductance, mounted over or on the base integrated circuit package 502. The passive component 606 can be mounted over or on the base integrated circuit package 502 adjacent the component 510 or the additional interface module 602.

The integrated circuit packaging system 500 can include a stack component 608, such as an integrated circuit, a die, a flip chip, or a chip having a redistribution layer (RDL). The stack component 608 can be mounted over or on the base integrated circuit package 502 adjacent the component 510, the interface module 522, or the additional interface module 602.

It has been discovered that the present invention can provide flexibility. The interface module 522 or the additional interface module 602 can be formed or mounted based on configurations of the base integrated circuit package 502 and any stacked components such as the first stack component 544, the second stack component 546, the third stack component 548, or any integrated circuit package in other embodiments. The present invention can provide any number of the interface module 522 and the additional interface module 602 attached in systems having an SiP configuration.

Figure 7:
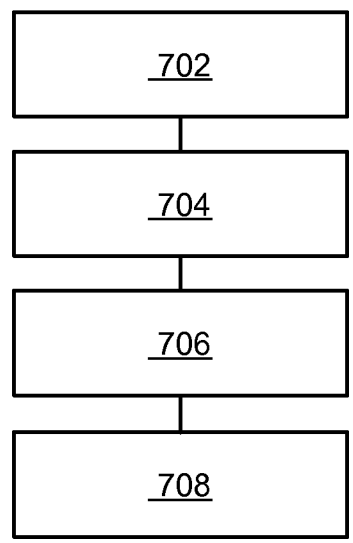
FIG. 7 is a flow chart of a method of manufacture of an integrated circuit packaging system in a further embodiment of the present invention.

Referring now to FIG. 7, therein is shown a flow chart of a method 700 of manufacture of an integrated circuit packaging system in a further embodiment of the present invention. The method 700 includes: providing a substrate in a block 702; mounting a component over a side of the substrate in a block 704; forming an interface module having a module via in any location for connectivity to the substrate in a block 706; and mounting the entirety of the interface module over a portion of the side of the substrate next to the component in a block 708.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   mounting a component over a side of the substrate;
   forming an interface module having a module via in any location for connectivity to the substrate; and
   mounting the entirety of the interface module over a portion of the side of the substrate next to the component; and
   molding an encapsulation over the substrate with the encapsulation having the interface module embedded therein, the encapsulation having a recess exposing the interface module.

2. The method as claimed in claim 1 wherein mounting the interface module includes connecting the interface module to the substrate.

3. The method as claimed in claim 1 further comprising mounting an additional interface module adjacent the component.

4. The method as claimed in claim 1 further comprising connecting a stack component to the interface module.

5. A method of manufacture of an integrated circuit packaging system comprising:
   providing a substrate;
   mounting a component over a side of the substrate;
   forming an interface module having a module via in any location for connectivity to the substrate;
   mounting the entirety of the interface module over a portion of the side of the substrate next to the component;

molding an encapsulation over the substrate with the encapsulation having the interface module embedded therein, the encapsulation having a recess exposing the interface module; and mounting a stack component over the interface module and connected to the substrate by the interface module.

6. The method as claimed in claim 5 wherein mounting the stack component over the interface module includes attaching a module-to-package interconnect.

7. The method as claimed in claim 5 wherein forming the interface module includes forming the interface module having a through-silicon via.

8. The method as claimed in claim 5 wherein mounting the interface module includes forming the interface module with silicon.

9. The method as claimed in claim 5 wherein:
forming the interface module includes forming the interface module having an outer side; and
molding the encapsulation includes molding the encapsulation having a top portion above the outer side.

10. An integrated circuit packaging system comprising:
a substrate;
a component over a side of the substrate;
an interface module having a module via in any location for connectivity to the substrate, the entirety of the interface module over a portion of the side of the substrate next to the component; and an encapsulation over the substrate with the encapsulation having the interface module embedded therein, the encapsulation having a recess exposing the interface module.

11. The system as claimed in claim 10 wherein the interface module is connected to the substrate.

12. The system as claimed in claim 10 further comprising an additional interface module adjacent the component.

13. The system as claimed in claim 10 further comprising a stack component connected to the interface module.

14. The system as claimed in claim 10 further comprising a stack component over the interface module and connected to the substrate by the interface module.

15. The system as claimed in claim 14 wherein the stack component over the interface module includes a module-to-package interconnect.

16. The system as claimed in claim 14 wherein the interface module includes a through-silicon via.

17. The system as claimed in claim 14 wherein the interface module is formed with silicon.

18. The system as claimed in claim 14 wherein:
the interface module includes an outer side; and
the encapsulation includes a top portion above the outer side.

* * * * *